United States Patent
Hori et al.

(10) Patent No.: US 6,693,302 B2
(45) Date of Patent: Feb. 17, 2004

(54) SEMICONDUCTOR LIGHT-EMITTING ELEMENT

(75) Inventors: Yuji Hori, Nagoya (JP); Tomohiko Shibata, Kasugai (JP); Mitsuhiro Tanaka, Handa (JP); Osamu Oda, Aichi-Pref. (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 10/035,001

(22) Filed: Dec. 28, 2001

(65) Prior Publication Data

US 2002/0149028 A1 Oct. 17, 2002

(30) Foreign Application Priority Data

Jan. 9, 2001 (JP) ........................................ 2001-001149

(51) Int. Cl.[7] ............................. H01L 27/15; H01L 29/20
(52) U.S. Cl. .......................................... 257/79; 257/615
(58) Field of Search .................................. 257/79, 615

(56) References Cited

U.S. PATENT DOCUMENTS

| | | | | |
|---|---|---|---|---|
| 5,571,391 A | * | 11/1996 | Teraguchi | 204/290 R |
| 5,998,925 A | * | 12/1999 | Shimizu et al. | 313/503 |
| 6,045,626 A | * | 4/2000 | Yano et al. | 148/33.4 |
| 6,104,074 A | * | 8/2000 | Chen | 257/453 |
| 6,242,764 B1 | * | 6/2001 | Ohba et al. | 257/190 |
| 6,277,664 B1 | * | 8/2001 | Lozykowski et al. | 438/22 |

* cited by examiner

*Primary Examiner*—Eddie Lee
*Assistant Examiner*—Joseph Nguyen
(74) *Attorney, Agent, or Firm*—Burr & Brown

(57) ABSTRACT

In a semiconductor light-emitting element, an underlayer is made of a high crystallinity Al-including semiconducting nitride material of which the FWHM is 90 seconds or below in full width at half maximum of an X-ray rocking curve. A light-emitting layer is made of a semiconducting nitride material including it least one element selected from the group consisting of Al, Ga and In and containing at least one element selected from rare earth metal elements. The light-emitting layer can be omitted if at least one element selected from rare earth metal elements is incorporated in the underlayer.

16 Claims, 1 Drawing Sheet

SEMICONDUCTOR LIGHT-EMITTING ELEMENT

This application claims priority from Japanese Application 2001-001,149, filed Jan. 9, 2001, the entirety of which is incorporated herein by reference.

BACKGROUND OF THE INVENTION

1. Field of the invention

This invention relates to a semiconductor light-emitting element, particularly usable for a white color light-emitting diode.

2. Related Art Statement

Recently, various light-emitting diodes (LEDs) are widely available. LEDs are expected for illuminating use as well as displaying use because of their low electric power consumption, long life time, $CO_2$ gas reduction originated from the reduction of the high energy consumption such as the low electric power consumption, and thus, much demand for the LEDs are expected.

As of now, the LEDs are made of various semiconducting materials such as GaAs-based semiconducting material, AlGaAs-based semiconducting material, GaP-based semiconducting material, GaAsP-based semiconducting material and InGaAlP-based semiconducting material, and thus, can emit various color lights from red to yellow-green. Therefore, the LEDs are employed particularly for various displaying use. Recently, blue and green LEDs have been realized by using GaN-based semiconducting materials. As a result, selecting a given LED, a given color light from red to blue, that is, within visible light range, can be obtained from the LED, and full-color displaying is also realized. Moreover, white color light-emitting diodes (white color LEDs) are being realized by using RGB LED chips or using two color light-emitting diodes composed of blue LEDs with a yellow fluorescent substance thereon. As a result, LED illumination is being realized at present.

However, the white color LED using the ROB LED chips requires higher cost because the plural LED chips are employed, so that in view of the cost, it is difficult to realize the white color LED for illumination use. On the other hand, full color can not be recognized by the white color LED using the two color light-emitting diode because it employs only two primary colors, instead of three primary colors. Moreover, in the white color LED, the brightness of only about 25 lm/W can be realized, which is very small as compared with the brightness of 90 lm/W of a fluorescent tube.

Therefore, a white color LED employing three primary colors is strongly desired because of the low energy consumption taking environmental problems into consideration. In reality, such a white color LED is intensely developed by Japanese national projects and foreign major electric-nanufacturing enterprises.

SUMMARY OF THE INVENTION

It is an object of the present invention to provide a new semiconductor light-emitting element preferably usable for a LED to emit an any color light, particularly a white color LED. Herein, the wording "LED" means all kinds of semiconductor light-emitting elements, including a PN-junction light-emitting element.

For achieving the above object, this invention relates to a semiconductor light-emitting element including a substrate and an underlayer formed on the substrate. The underlayer is made of a first semiconducting nitride material including at least Al element and has a crystallinity of 90 seconds or below in full width at half maximum of an X-ray rocking curve.

A light-emitting layer is formed on the underlayer and is made of a second semiconducting nitride material including at least one element selected from the group consisting of Al, Ga and In, and at least one element selected from rare earth metal elements.

A first electrode is a Schottky electrode and a second electrode is a Schottky electrode or an ohmic electrode, which are formed on the light-emitting layer.

The inventors intensely studied to obtain a semiconductor light-emitting element to emit a given color light, particularly a white color light. As a result, they discovered the following facts. That is, if, in a semiconductor light-emitting element including a substrate, an underlayer, a light-emitting layer, a first electrode made of a Schottky electrode and a second electrode made of a Schottky electrode or an ohmic electrode on the light-emitting layer; and the light-emitting layer is made of a semiconducting nitride material containing at least one element selected from the group consisting of Al, Ga, In, the crystallinity of the underlayer is developed, and a given rare earth metal element is incorporated in the light-emitting layer, the inherent color light originated from the rare earth metal is emitted from the light-emitting layer at a relatively large intensity.

In the abovementioned semiconductor light-emitting element, since a given rare earth metal element is incorporated into the light-emitting layer, the inherent color light originated from the rare earth metal element is emitted from the light-emitting layer when the light-emitting layer is excited by an electric current injected from the electrodes.

Therefore, by selecting a given element from rare earth metal group appropriately, a desired color light is emitted through the semiconductor light-emitting element. Moreover, if plural rare earth metal elements are selected appropriately, the inherent color lights originated from the respective rare earth metal elements are superimposed, and thus, a white color light can be generated at and emitted from the semiconductor light-emitting element.

In the present invention, such a rare earth metal element may be directly incorporated into the underlayer. In this case, the underlayer doubles as a light-emitting layer, and thus, the above-mentioned light-emitting layer separated from the underlayer may be omitted.

BRIEF DESCRIPTION OF THE DRAWINGS

For better understanding of the present invention, reference is made to the attached drawings, wherein.

DESCRIPTION OF THE PREFERRED EMBODIMENTS

This invention will be described in detail with reference to the accompanying drawings.

Figure 1:
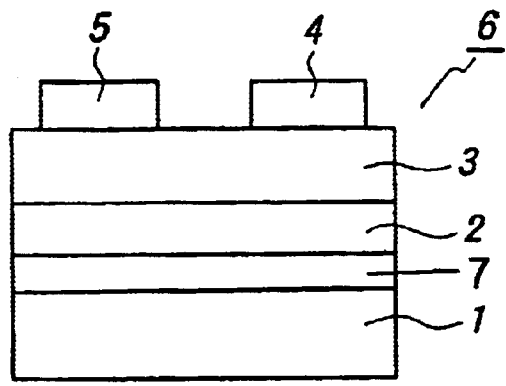
FIG. 1 is a cross sectional view showing a semiconductor light-emitting element according to the present invention.

FIG. 1 is a cross sectional view showing a semiconductor light-emitting element according to the present invention. For clarifying the features of the present invention, some constituent elements in FIG. 1 are different from the real ones. A semiconductor light-emitting element 6 depicted in FIG. 1 includes a substrate 1, an underlayer 2 made of AlN as a first semiconducting nitride material which is provided on the substrate 1, and a light-emitting layer 3 made of AlGaN as a second semiconducting nitride material which is provided on the underlayer 2. A Schottky electrode 4 (as a first electrode) and an ohmic electrode 5 (as a second electrode) are provided on light-emitting layer 3.

In the present invention, it is required that at least one rare earth metal element is incorporated in the light-emitting layer 3. The content of rare earth metal element is not restricted, but selected appropriately dependent on the kind of the rare earth metal element, the material composition of the second semiconducting nitride material composing the light-emitting layer 3 and a desired light intensity.

It is desired that the rare earth metal element is incorporated in the light-emitting layer 3 as much as possible so as not to deteriorate the crystallinity of the light-emitting layer 3. Concretely, the content of rare earth metal element is preferably set to 0.01–7 atomic percentages. In this case, a light of about 30 (lm/W) intensity can be emitted from the light-emitting layer 3, and thus, the semiconductor light-emitting element 6.

The kind of rare earth metal element is not restricted, but appropriately selected on the kind of a desired color light. For example, Tm element may be employed to generate a blue color wavelength-region light, and Er element may be employed to generate a green color wavelength-region light, and Eu or Pr element may be employed to generate a red color wavelength-region light.

Then, if these rare earth metal elements are incorporated into the light-emitting layer 3, the blue color light, the green color light and the red color light are superimposed, thereby to generate and emit an any color light or a white color light. The rare earth metal element can be incorporated by a MOCVD method using the rare earth metal element raw material gas at the same time when the light-emitting layer 3 is formed, or by an ion implantation method after the light-emitting layer 3 is formed.

The inventors also found out the following fact of the matter. In a light-emitting layer containing a rare earth metal element, the luminous efficiency originated from the rare earth metal element is enhanced as the bandgap of the semiconducting material composing the light-emitting layer is increased. Also, the bandgap of the semiconducting material is increased as the Al content of the semiconducting material is increased.

Therefore, it is desired that the second semiconducting material composing the light-emitting layer 3 includes a relatively large amount of Al. Concretely, the Al content of the second semiconducting material is preferably set to 50 atomic percentages or more for all of the III elements in light-emitting layer 3, particularly 70 atomic percentages or more.

Also, it is required to emit a light stably at a practically usable intensity originated from a relatively large amount of rare earth metal elements that the crystal quality of the light-emitting layer 3 is developed, and thus, there are less dislocation density due to the difference in lattice constant in the light-emitting layer. In this point of view, the crystallinity of the underlayer 2 is set to 90 seconds or below, particularly 50 seconds or below in fill width of half maximum (FWHM of an X-ray rocking curve at (0002) plane reflection.

The lower limited value of the crystallinity of the underlayer 2 is not restricted, but usually set to about 10 seconds in FWHM of an X-ray rocking curve.

Such a high crystallinity underlayer 2 can be formed at 1100° C. or more, particularly 1150° C. or more by a MOCVD method, which is much higher than the formation temperature of an underlayer in a conventional semiconductor light-emitting element which is set within 500–700° C. That is, the high crystallinity underlayer 2 can be formed by a MOCVD method under quite different conditions from conventional underlayers.

The upper limited value of the formation temperature for such a high crystallinity underlayer 2 is not restricted, but preferably set to 1250° C. In this case, the surface roughness due to the material composition of the first semiconducting nitride material composing the underlayer 2 and the diffusion of the constituent elements of the underlayer 2 can be effectively inhibited. That is, regardless of the material composition of the first semiconducting nitride material, the crystallinity of the underlayer 2 can be maintained higher, and the deterioration in crystallinity of the underlayer 2 due to the surface roughness can be inhibited. Herein, the "formation temperature" means the "temperature of the substrate 1 as the underlayer 2 is formed".

The Al content of the first semiconducting material composing the underlayer 2 is preferably set to 50 atomic percentages or more for all of the III elements in the underlayer. In particular, the underlayer 2 is made of AlN (100 atomic percentages of Al).

In a semiconducting nitride material containing Al element, the lattice constant becomes larger as the Al content is increased. Therefore, if the underlayer 2 is made of a semiconducting nitride material including a large amount of Al element, much dislocations due to misfit dislocations may be created in the underlayer 2, and then, the breakaway of the underlayer 2 may occur.

In this case, it is desired that a bluffer layer 7 is provided between the substrate 1 and the underlayer 2 so that the Al content of the buffer layer 7 is continuously or stepwisely increased from the substrate 1 toward the underlayer 2. The difference in lattice constant between the substrate 1 and the underlayer 2 is cancelled by the buffer layer, and thus, the dislocations in the underlayer 2 can be effectively reduced, and the breakaway of the underlayer 2 can be effectively inhibited.

It is required that the first semiconducting nitride material includes Al element and the second semiconducting nitride material includes at least one element selected from the group consisting of Al, Ga and In. In addition, the semiconducting nitride materials may include an additive element such as Mg, Be, Zn, Si, P, As, O (oxygen) or B as occasion demands. Moreover, the semiconducting nitride materials may include a minute impurity contained in the raw material gases and the reactor or contained dependent on the forming condition.

It is also desired that the Schottky electrode 4 and the ohmic electrode 5 are made of InSn oxides or the like, and are transparent within visible light range.

The substrate 1 may be made of oxide single crystal such as sapphire single crystal, ZnO single crystal, LiAlO$_2$ single crystal, LiGaO$_2$ single crystal, MgAl$_2$O$_4$ single crystal, or MgO single crystal, IV single crystal or IV—IV single crystal such as Si single crystal or SiC single crystal, III–V single crystal such as GaAs single crystal, AlN single crystal, GaN single crystal or AlGaN single crystal, and boride single crystal such as Zr$_2$B.

The semiconductor light-emitting element 6 shown in FIG. 1 may be fabricated by a normal process as far as the requirements of the present invention are satisfied.

Figure 2:
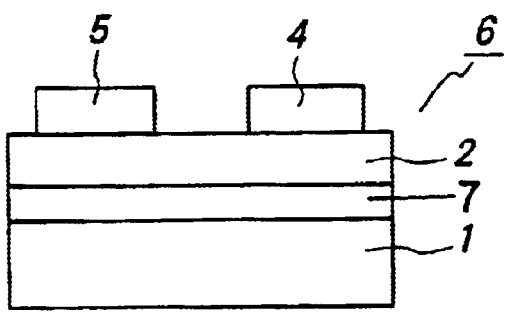
FIG. 2 is a cross sectional view showing another semiconductor light-emitting element according to the present invention.

In the present invention, moreover, a rare earth metal element may be incorporated in the underlayer 2. In this case, the light-emitting layer 3 is omitted. FIG. 2 is a cross sectional view showing such a semiconductor light-emitting element. In the semiconductor light-emitting element 6 shown in FIG. 2, the Schottky electrode 4 and the ohmic electrode 4 are directly provided on the underlayer 2, and a given light is generated at and emitted from the underlayer 2. As a result, the underlayer 2 doubles as a light-emitting layer.

EXAMPLE

A sapphire single crystal substrate having a diameter of 2 inches and a thickness of 430 μm was employed, and thus, pretreated by $H_2SO_4+H_2O_2$, and set into a MOCVD apparatus. To the MOCVD apparatus was attached a gas system of $NH_3$, TMA, TMG and $SiH_4$. The substrate was heated to 1200° C. with flowing an $H_2$ carrier gas at a flow rate of 10 m/sec. Then, a trimethylalurninum (TMA) gas and an ammonia ($NH_3$) gas were introduced and supplied onto the substrate at an average flow rate of 10 m/sec, to form an AlN layer as an underlayer in a thickness of 1 μm on the substrate. The FWHM of the AlN layer was 90 seconds, and thus, the good crystallinity of the AlN layer was confirmed.

Then, for protecting the AlN layer, a trimethylgallium (TMG) gas and an $NH_3$ gas were supplied onto the AlN layer at an average rate of 10 m/sec, to form a GaN film in a thickness of 100 Å on the AlN layer. Thereafter, the substrate having the AlN layer and the GaN film was taken out of the MOCVD apparatus, and then, set into a MBE apparatus.

To the MBE apparatus were attached a solid raw material system of 7N—Ga, 7N—In, 6N—Al, 3N—Er, 3N—Tm, 3N—Eu and a nitrogen gas system of atomic nitrogen gas generated by the high frequency plasma-generating apparatus at SVTA Co. Ltd.

First of all, the substrate was heated to 900° C., and an $H_2$ gas and an $NH_3$ gas were flown, to remove the GaN film as a protective layer. Thereafter, tile substrate was heated to 1000° C. and held for 30 minutes, to flatten the surface of the AlN layer, and an $Al_{0.1}Ga_{0.9}N$ layer was formed, as a light-emitting layer, in a thickness of 0.1 μm on the AlN layer at 700° C. During the formation of the $Al_{0.1}Ga_{0.9}N$ layer, Er element, Tm element, and Eu element were doped at a doping ratio of 0.5 atomic percentages.

Then, transparent electrodes made of InSn oxides were provided, as Schottky electrodes, on the $Al_{0.1}Ga_{0.9}N$ layer.

Thereafter, when a voltage of 20V was applied between the transparent electrodes, a white color light was emitted from the element at a high luminous efficiency. Therefore, the semiconductor light-emitting element obtained in this Example can be practically used as a white color light-emitting element.

Although the present invention was described in detail with reference to the above examples, this invention is not limited to the above disclosure and variations and modifications may be made without departing from the spirit and scope of the present invention.

For example, in the semiconductor light-emitting elements shown in FIG. 1 and Example, although the light-emitting layer is formed directly on the underlayer, it may be formed on a buffer layer or a multilayered structure such as a distorted superlartice structure.

As mentioned above, the semiconductor light-emitting element of the present invention includes a high crystallinity underlayer, and thus, a high crystallinity light-emitting layer. Then, a given rare earth metal element is incorporated in the light-emitting layer, and excited by an electric current flown through the semiconductor light-emitting element. Therefore, a given color light originated from the rare earth metal element can be generated at and emitted from the semiconductor light-emitting element.

Moreover, by selecting plural rare earth metal elements appropriately, plural color lights originated from the rare earth metal elements are superimposed, to generate and emit a white color light at a practically usable efficiency.

What is claimed is:

1. A semiconductor light-emitting element comprising:
    a substrate,
    an underlayer, formed on the substrate, comprising a first semiconducting nitride material including at least Al and having a crystallinity of 90 seconds or below in full width at half maximum of an X-ray rocking curve,
    a light-emitting layer, formed on the underlayer, comprising a second semiconducting nitride material including at least one element selected from the group consisting of Al, Ga and In and at least one element selected from rare earth metal elements, and
    a first electrode being a Schottky electrode and a second electrode being a Schottky electrode or an ohmic electrode formed on the light-emitting layer.

2. A semiconductor light-emitting element as defined in claim 1, wherein the content of the rare earth metal element in the second semiconducting nitride material is set to 0.01–7 atomic percent.

3. A semiconductor light-emitting element as defined in claim 1, wherein the Al content of the first semiconducting nitride material is at least 50 atomic percent of all group III elements of the Periodic Table.

4. A semiconductor light-emitting element as defined in claim 3, wherein the first semiconducting nitride material is AlN.

5. A semiconductor light-emitting element as defined in claim 1, further comprising a buffer layer having an Al content that is continuously or stepwisely increased from the substrate toward the underlayer.

6. A semiconductor light-emitting element as defined in claim 1, wherein the underlayer is formed from the first semiconducting nitride material at a temperature of 1100° C. or more by a MOCVD method.

7. A semiconductor light-emitting element as defined in claim 6, wherein the underlayer is formed within a temperature range of 1100–1250° C.

8. A semiconductor light-emitting element as defined in claim 1, wherein at least one of the first electrode and the second electrode comprises a transparent material within the range of visible light.

9. A semiconductor light-emitting element comprising:
    substrate,
    a semiconductor nitride layer, formed on the substrate, including at least Al and at least one element selected from rare earth metal elements and having a crystallinity of 90 seconds or below in full width at half maximum of an X-ray rocking curve, and
    a first electrode being a Schottky electrode and a second electrode being a Schottky electrode or an ohmic electrode formed on the light-emitting layer.

10. A semiconductor light-emitting element as defined in claim 9, wherein the content of the rare earth metal element in the semiconductor nitride layer is set to 0.01–7 atomic percent.

11. A semiconductor light-emitting element as defined in claim 9, wherein the Al content of the semiconductor nitride layer is at least 50 atomic percent of all group III elements of the Periodic Table.

12. A semiconductor light-emitting element as defined in claim 11, wherein the semiconductor nitride layer is made of AlN.

13. A semiconductor light-emitting element as defined in claim 9, further comprising a buffer layer having an Al content that is continuously or stepwisely increased from the substrate toward the semiconductor nitride layer.

14. A semiconductor light-emitting element as defined in claim 9, wherein the semiconductor nitride layer is formed at a temperature of 1100° C. or more by a MOCVD method.

15. A semiconductor light-emitting element as defined in claim 14, wherein the semiconductor nitride layer is formed within a temperature range of 1100–1250° C.

16. A semiconductor light-emitting element as defined in claim 9, wherein at least one of the first electrode and the second electrode comprises a transparent material within the range of visible light.

* * * * *